(12) United States Patent
Fukuzumi et al.

(10) Patent No.: US 8,008,710 B2
(45) Date of Patent: Aug. 30, 2011

(54) NON-VOLATILE SEMICONDUCTOR STORAGE DEVICE

(75) Inventors: Yoshiaki Fukuzumi, Yokohama (JP); Ryota Katsumata, Yokohama (JP); Masaru Kito, Yokohama (JP); Masaru Kidoh, Komae (JP); Hiroyasu Tanaka, Tokyo (JP); Megumi Ishiduki, Yokohama (JP); Yosuke Komori, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 208 days.

(21) Appl. No.: 12/501,142

(22) Filed: Jul. 10, 2009

(65) Prior Publication Data

US 2010/0038703 A1    Feb. 18, 2010

(30) Foreign Application Priority Data

Aug. 12, 2008 (JP) ................................ 2008-207655

(51) Int. Cl.
*H01L 29/792* (2006.01)
(52) U.S. Cl. .......... 257/326; 257/E29.309; 257/E27.102
(58) Field of Classification Search .................. 257/326, 257/E29.309, E27.102
See application file for complete search history.

(56) References Cited

U.S. PATENT DOCUMENTS

| | | | |
|---|---|---|---|
| 7,847,342 B2 * | 12/2010 | Fukuzumi et al. | 257/324 |
| 7,910,973 B2 * | 3/2011 | Sakaguchi et al. | 257/298 |
| 7,910,979 B2 * | 3/2011 | Matsuoka et al. | 257/324 |
| 2007/0252201 A1 | 11/2007 | Kito et al. | |
| 2009/0146206 A1 | 6/2009 | Fukuzumi et al. | |
| 2010/0207195 A1 * | 8/2010 | Fukuzumi et al. | 257/326 |

FOREIGN PATENT DOCUMENTS

| | | |
|---|---|---|
| JP | 2007-317874 | 12/2007 |
| KR | 10-2007-0096972 | 10/2007 |
| WO | WO 2009/075370 A1 | 6/2009 |
| WO | WO 2010/004706 A1 | 1/2010 |

OTHER PUBLICATIONS

U.S. Appl. No. 12/980,856, filed Dec. 29, 2010, Ishihara et al.
Korean Office Action issued on Jan. 12, 2011, in the corresponding Korean Application No. 10-2009-73728 (with English Translation).
Notice of Allowance issued Mar. 28, 2011, in Korea Patent Application No. 10-2009-0073728.
U.S. Appl. No. 12/694,677, filed Jan. 27, 2010, Fukuzumi et al.
U.S. Appl. No. 12/679,991, filed Mar. 25, 2010, Fukuzumi et al.
U.S. Appl. No. 12/132,181, filed Jun. 3, 2008, Hiroyasu Tanaka, et al.
U.S. Appl. No. 12/559,865, filed Sep. 15, 2009, Fukuzumi, et al.

* cited by examiner

*Primary Examiner* — Trung Dang
(74) *Attorney, Agent, or Firm* — Oblon, Spivak, McClelland, Maier & Neustadt, L.L.P.

(57) ABSTRACT

A memory string has a semiconductor layer with a joining portion that is formed to join a plurality of columnar portions extending in a vertical direction with respect to a substrate and lower ends of the plurality of columnar portions. First conductive layers are formed in a laminated fashion to surround side surfaces of the columnar portions and an electric charge storage layer, and function as control electrodes of memory cells. A second conductive layer is formed around the plurality of columnar portions via a gate insulation film, and functions as control electrodes of selection transistors. Bit lines are formed to be connected to the plurality of columnar portions, respectively, with a second direction orthogonal to a first direction taken as a longitudinal direction.

20 Claims, 14 Drawing Sheets

NON-VOLATILE SEMICONDUCTOR STORAGE DEVICE

CROSS REFERENCE TO RELATED APPLICATIONS

This application is based on and claims the benefit of priority from prior Japanese Patent Application No. 2008-207655, filed on Aug. 12, 2008, the entire contents of which are incorporated herein by reference.

BACKGROUND OF THE INVENTION

1. Field of the Invention

The present invention relates to an electrically rewritable non-volatile semiconductor storage device.

2. Description of the Related Art

Conventionally, LSIs are formed by integration of devices in a two-dimensional plane on the silicon substrate. Although it is common to reduce (refine) the dimension for each device for increased memory storage capacity, recent years are facing challenges in such refinement from the viewpoint of cost and technology. Such refinement requires further improvements in photolithography technology. However, the costs of lithography process are ever increasing. In addition, if such refinement is accomplished, it is assumed that physical improvement limit, such as in breakdown voltage between devices, would be reached unless driving voltage can be scaled. That is, it is likely that difficulties would be encountered in device operation itself.

Therefore, a large number of semiconductor storage devices have been proposed recently where memory cells are arranged in a three-dimensional manner to achieve improved integration of memory devices (see, for example, Japanese Patent Laid-Open No. 2007-266143; U.S. Pat. No. 5,599,724; and U.S. Pat. No. 5,707,885).

One of the conventional semiconductor storage devices where memory cells are arranged in a three-dimensional manner uses transistors with a cylinder-type structure. Those semiconductor storage devices using transistors with the cylinder-type structure are provided with multiple conductive layers corresponding to gate electrodes and pillar-like columnar semiconductors. Each of the columnar semiconductors serves as a channel (body) part of each of the transistors. Memory gate insulation layers are provided around the columnar semiconductors. Such a configuration including these conductive layers, columnar semiconductors, and memory gate insulation layers is referred to as a "memory string".

For three-dimensional memory with pillar-like columnar semiconductors as disclosed in the patent documents mentioned above, for example, although bit lines can be formed on the top surface of the lamination structure, source lines should be formed on the bottom surface of the lamination structure, and their contacts should also be formed with trenches dug down to the bottom surface of the lamination structure. In general, source lines are highly doped with impurities for lowering resistance. To mitigate thermal diffusion of impurities from the source lines while keeping good contact resistance with such source lines, sensitive interface control is required for different thermal processes.

In this respect, such a three-dimensional type non-volatile semiconductor storage device has been disclosed in, e.g., Japanese Patent Laid-Open No. 2007-317874, where memory strings are formed in U-shape, enabling both bit lines and source lines to be formed on the surface of the lamination structure.

However, Japanese Patent Laid-Open No. 2007-317874 requires word lines to be formed separately for each memory string, which poses a problem that the wiring resistance of the word lines cannot be reduced.

SUMMARY OF THE INVENTION

One aspect of the present invention provides a non-volatile semiconductor storage device comprising a plurality of memory strings, each having a plurality of electrically rewritable memory cells and selection transistors connected in series, each of the memory strings comprising: a semiconductor layer having a plurality of columnar portion and a joining portion, the plurality of columnar portions extending in a vertical direction with respect to a substrate, the joining portion being formed to join lower ends of the plurality of columnar portions with a first direction taken as a longitudinal direction; an electric charge storage layer formed to surround side surfaces of the columnar portions; a plurality of first conductive layers formed in a laminated fashion to surround side surfaces of the columnar portions and the electric charge storage layer, the first conductive layers functioning as control electrodes of the memory cells; a second conductive layer formed around the plurality of columnar portions aligned in the first direction via a gate insulation film, with the first direction taken as a longitudinal direction, the second conductive layer functioning as control electrodes of the selection transistors; and bit lines formed to be connected to the plurality of columnar portions, respectively, with a second direction orthogonal to the first direction taken as a longitudinal direction.

DETAILED DESCRIPTION OF THE EMBODIMENTS

Embodiments of a non-volatile semiconductor storage device according to the present invention will now be described below with reference to the accompanying drawings.

First Embodiment

Figure 1:
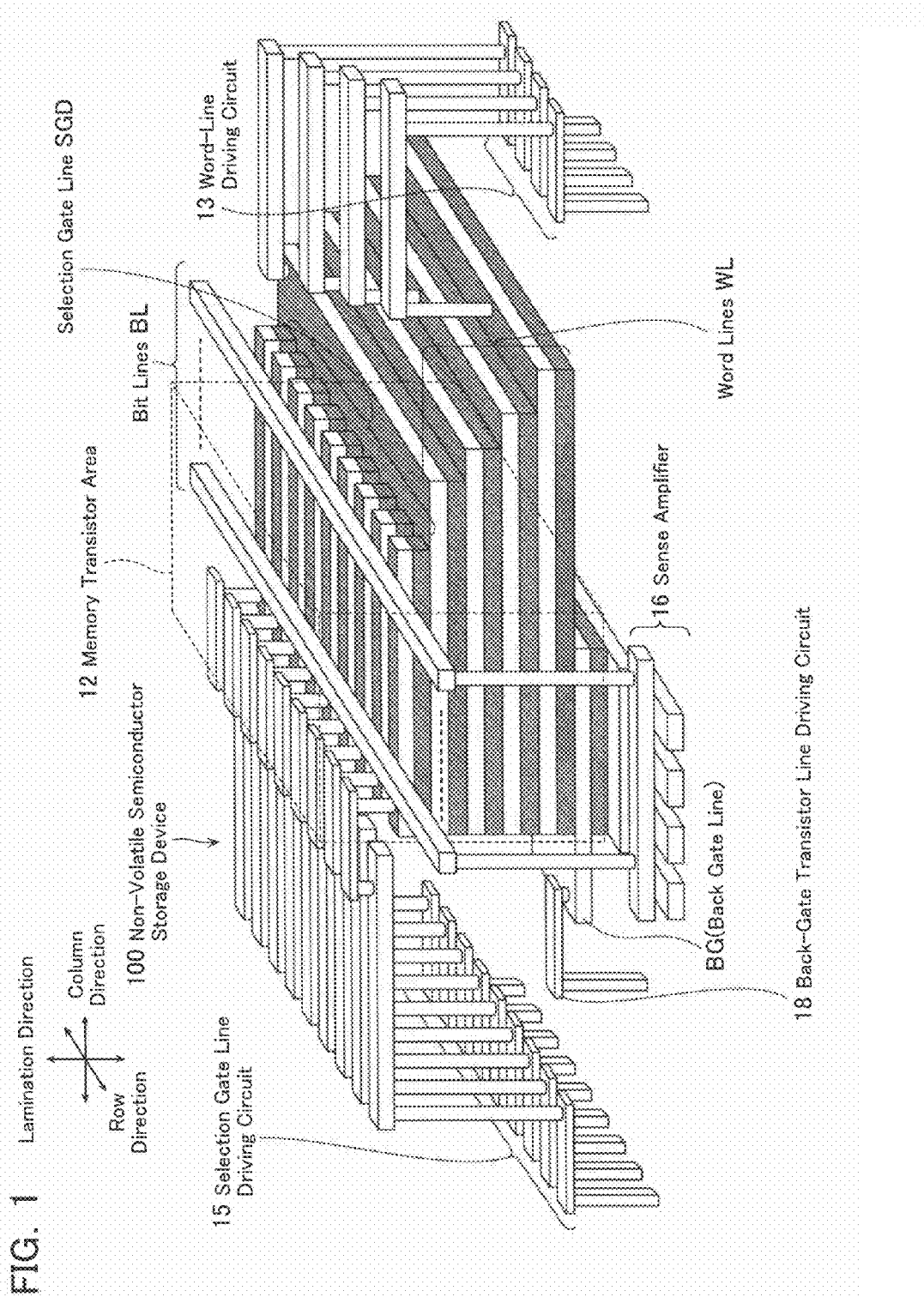
FIG. 1 is a schematic diagram of a non-volatile semiconductor storage device 100 according to a first embodiment of the present invention.

Configuration of Non-Volatile Semiconductor Storage Device 100 in First Embodiment FIG. 1 schematically illustrates a non-volatile semiconductor storage device 100 according to a first embodiment of the present invention. As illustrated in FIG. 1, the non-volatile semiconductor storage device 100 according to the first embodiment mainly comprises: a memory transistor area 12; a word-line driving circuit 13; a selection gate line driving circuit 15; a sense amplifier 16; and a back-gate transistor driving circuit 18.

The memory transistor area 12 has memory transistors for storing data. The memory transistors are connected in series to provide memory strings, as discussed below. In addition, selection transistors are connected to the opposite ends of the memory strings. The word-line driving circuit 13 controls voltage applied to word lines WL. The selection gate line driving circuit 15 controls voltage applied to selection gate lines SG.

The sense amplifier 16 amplifies a potential read from a memory transistor. The back-gate transistor driving circuit 18 controls voltage applied to a back-gate line BG described below. In addition to this, the non-volatile semiconductor storage device 100 according to the first embodiment comprises a bit-line driving circuit (not illustrated) for controlling voltage applied to bit lines BL.

Figure 2:
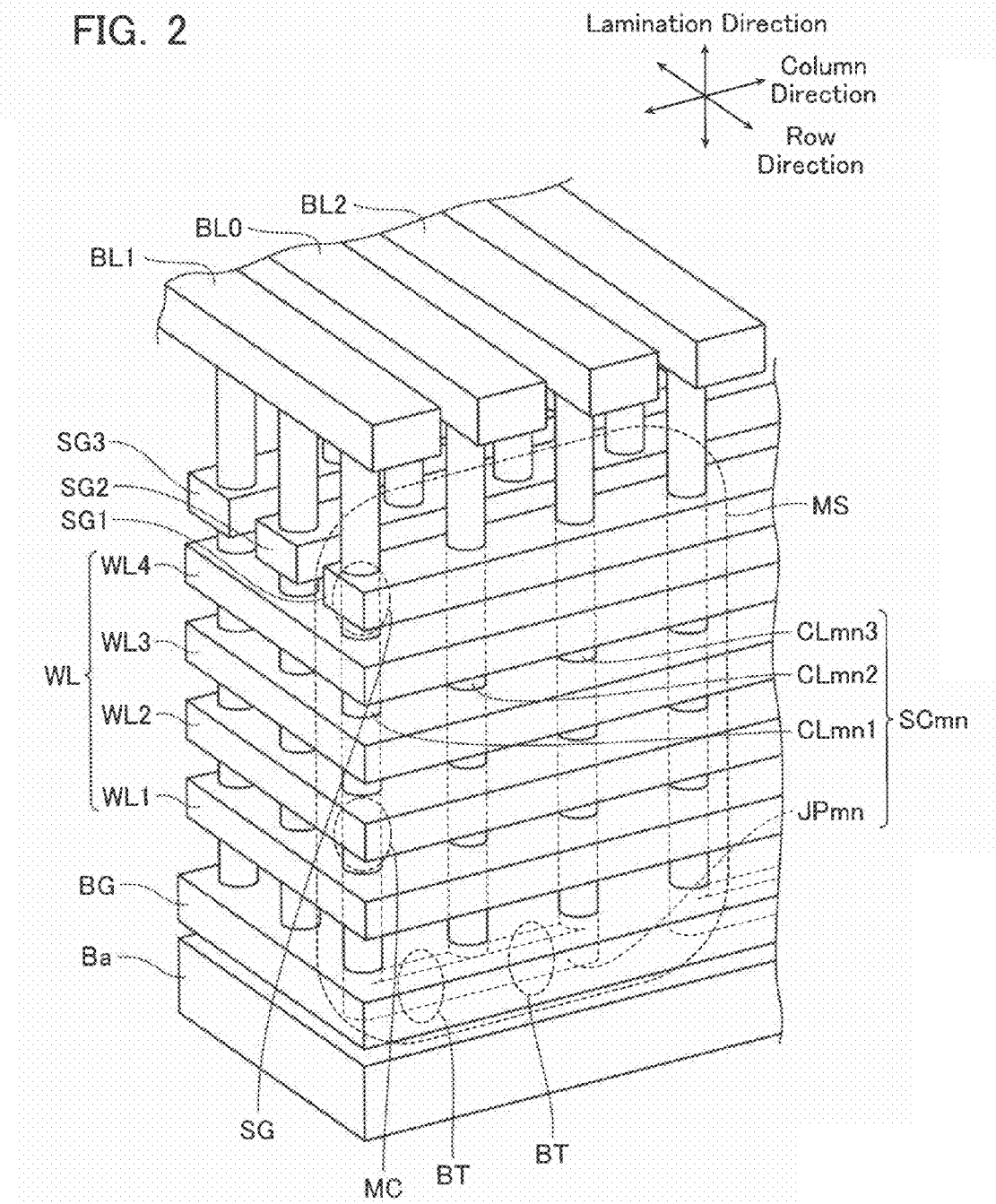
FIG. 2 is a perspective view schematically illustrating a part of the memory transistor area 12 in the non-volatile semiconductor storage device 100 according to the first embodiment.

FIG. 2 is a perspective view schematically illustrating a part of the memory transistor area 12 in the non-volatile semiconductor storage device 100 according to the first embodiment. According to the first embodiment, the memory transistor area 12 has memory strings MS arranged in the form of m×n matrix on a substrate Ba (where m and n are natural numbers), each memory string including a plurality of memory transistors MC and selection transistors SG. In FIG. 2, given that m=3, n=2.

In the non-volatile semiconductor storage device 100 according to the first embodiment, a plurality of memory strings MS are provided in the memory transistor area 12. As described in detail below, in the non-volatile semiconductor storage device 100, each memory string MS has a plurality of electrically rewritable memory transistors MC connected in series and parallel (so as to form a W-shape). As illustrated in FIGS. 1 and 2, the memory transistors MC included in a memory string MS are formed and arranged in a three-dimensional manner on the substrate Ba by laminating multiple semiconductor layers.

Each memory string MS has a W-shaped semiconductor layer $SC_{mn}$, word lines WL1 to WL4, and a selection gate line SG. In addition, the memory strings MS have a back-gate line BG.

Each W-shaped semiconductor layer $SC_{mn}$ is formed in a W-shape form (sideways E-shape or comb-like form) as viewed from the row direction. Each W-shaped semiconductor layer $SC_{mn}$ has a plurality of (three, in this case) columnar portions $CL_{mn}$ extending in substantially the vertical direction with respect to the semiconductor substrate Ba, and a joining portion $JP_{mn}$ formed to join the lower ends of the respective columnar portions $CL_{mn}$. The joining portion $JP_{mn}$ is formed with the column direction illustrated in FIG. 2 taken as the longitudinal direction. The three columnar portions $CL_{mn}$ included in one memory string MS are also formed in line along the column direction.

Although not illustrated in FIG. 2, an electric charge storage layer, which is a part of a memory cell, is formed around the plurality of columnar portions $CL_{mn}$ via a tunnel insulation film as described below, and a block insulation film is further formed around the electric charge storage layer. In addition, word lines WL1 to WL4 are formed around the plurality of columnar portions $CL_{mn}$ via the tunnel insulation film, the electric charge storage layer, and the block insulation film.

The word lines WL1 to WL4 are formed by laminating multiple layers of conductive films on the substrate Ba via an interlayer insulation film, not illustrated in FIG. 2. The word lines WL1 to WL4 are formed as plate-like electrodes that are commonly connected to m×n memory strings MS arranged in a two-dimensional manner and in a grid pattern on the substrate Ba. Because of the plate-like shapes commonly connected to the memory strings arranged in a matrix form, instead of being formed in an elongated stripe pattern (in strips) per memory strings arranged in a line, the word lines WL1 to WL4 may provide a lower wiring resistance as compared with being formed in an elongated stripe pattern.

The selection gate lines SG are commonly connected to a plurality of columnar portions $CL_{mn}$ aligned in the column direction so that they provide a stripe pattern on the tip sides of the columnar portions $CL_{mn}$, with the column direction taken as the longitudinal direction. That is, a plurality of memory strings MS aligned in the row direction are each connected to different selection gate lines SG1, SG2, and SG3.

The back-gate line BG comes in contact with the joining portion $JP_{mn}$ via a gate insulation film, not illustrated. Each joining portion $JP_{mn}$ has two back gate transistors BT formed therein, with their gate electrodes included in the back-gate line BG.

In addition, bit lines BL are formed along the columnar portions $CL_{mn}$ aligned in the row direction, with the row direction taken as the longitudinal direction. Three columnar portions CLmn1 to CLmn3 included in one memory string MS are each connected to different bit lines BL0 to BL2.

Figure 3:
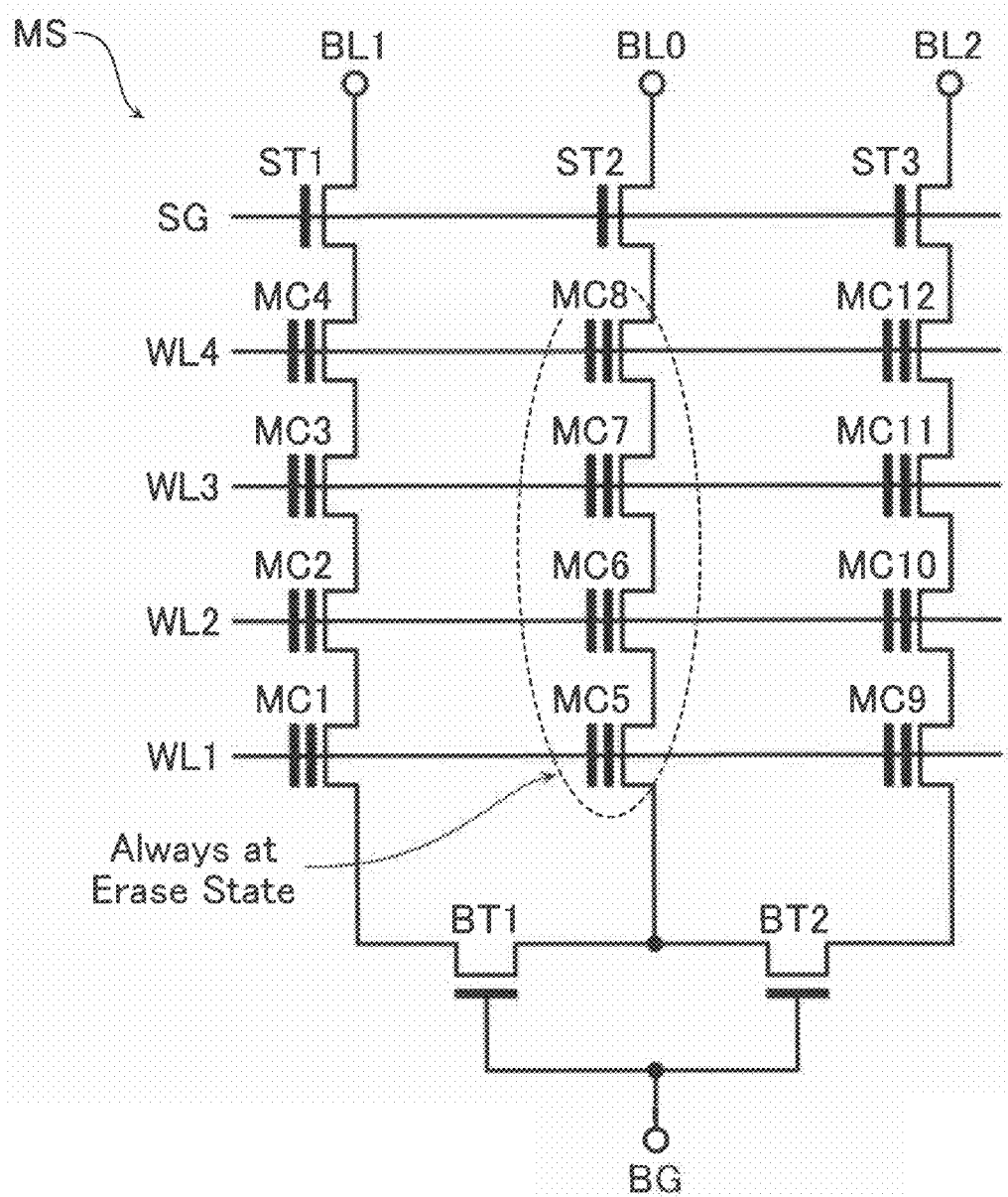
FIG. 3 is an equivalent circuit diagram of one memory string MS.

FIG. 3 is an equivalent circuit diagram of one memory string MS. This memory string MS has four memory cells MC formed therein for each columnar portion $CL_{mn}$, and a total of 12 (4×3) memory cells MC for three columnar portions CLmn1 to CLmn3. The left columnar portion $CL_{mn}1$ has memory transistors MC1 to MC4 formed therein. The middle columnar portion $CL_{mn}2$ has memory transistors MC5 to MC8 formed therein. The right columnar portion $CL_{mn}3$ has memory transistors MC9 to MC12 formed therein.

The memory transistors MC1, MC5, and MC9 are commonly connected to the word line WL1 in the lowest layer closest to the substrate Ba. The memory transistors MC2, MC6, and MC10 are commonly connected to the word line WL2 in the second lowest layer. The memory transistors MC3, MC7, and MC11 are commonly connected to the word line WL3 in the third lowest layer. The memory transistors MC4, MC8, and MC12 are commonly connected to the word line WL4 in the highest layer.

In addition, the joining portion $JP_{mn}$ has two back gate transistors BT1 and BT2 that are formed at respective positions between three columnar portions $CL_{mn}1$ to $CL_{mn}3$, with their gates included in the back gate layer BG.

In this embodiment, those memory transistors MC that are formed along at least one of three columnar portions $CL_{mn}$ are always kept at an erase state (where data "1" is retained) by a write/erase control circuit, not illustrated (herein, an "erase state" means that the memory cell MC is normally kept in a conductive state irrespective of voltages that may be applied to a control electrode thereof. Specifically, "erase state" represents where the memory transistor MC has a low threshold voltage (e.g., a negative value) and can be conductive when a predetermined read voltage (e.g., ground voltage Vss=0V) is applied to the control gate thereof). That is, at least one of the sets of four memory transistors, each formed along one columnar portion $CL_{mn}$, will be always kept at an erase state. Specifically, at least one set (four memory transistors) will be kept at an erase state, among the sets of memory transistors MC1 to MC4, MC5 to MC8, and MC9 to MC12. This measure is taken because write and read operations may still be performed when the word lines WL with a plate-like structure are utilized as described above, which will be discussed in detail below. As an example, the following description is based on the assumption that the memory transistors MC5 to MC8 connected to the middle columnar portion CLmn2 are always kept at erase states.

In addition, selection transistors ST1 to ST3 are formed on the upper ends of the plurality of columnar portions $CL_{mn}$. The selection transistors ST1 to ST3 are commonly connected to one selection gate line SG and become conductive at the same time. Such memory strings MS are arranged in a two-dimensional matrix form on the substrate Ba, with the word lines WL1 to WL4 being connected in common. Note that the columnar portions $CL_{mn}$ may be columnar or prismatic in shape. The columnar portions $CL_{mn}$ may also be terraced columnar shape. Furthermore, as illustrated in FIG. 1, the word lines WL1 to WL4 have their column-direction ends formed in a stepwise manner in relation to each other for contact purpose.

Figure 4:
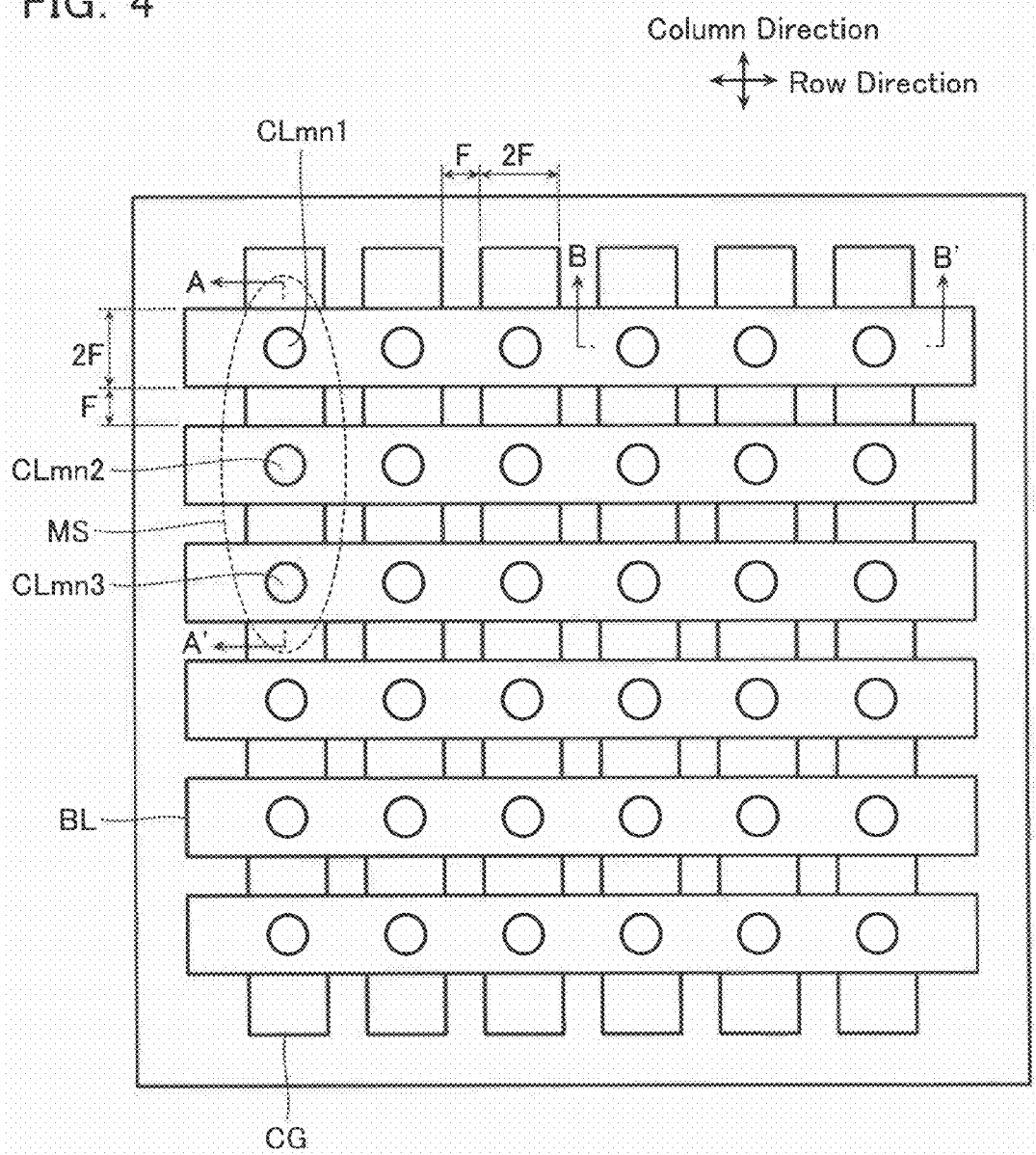
FIG. 4 is a plan view of the memory transistor area 12.
Figure 5:
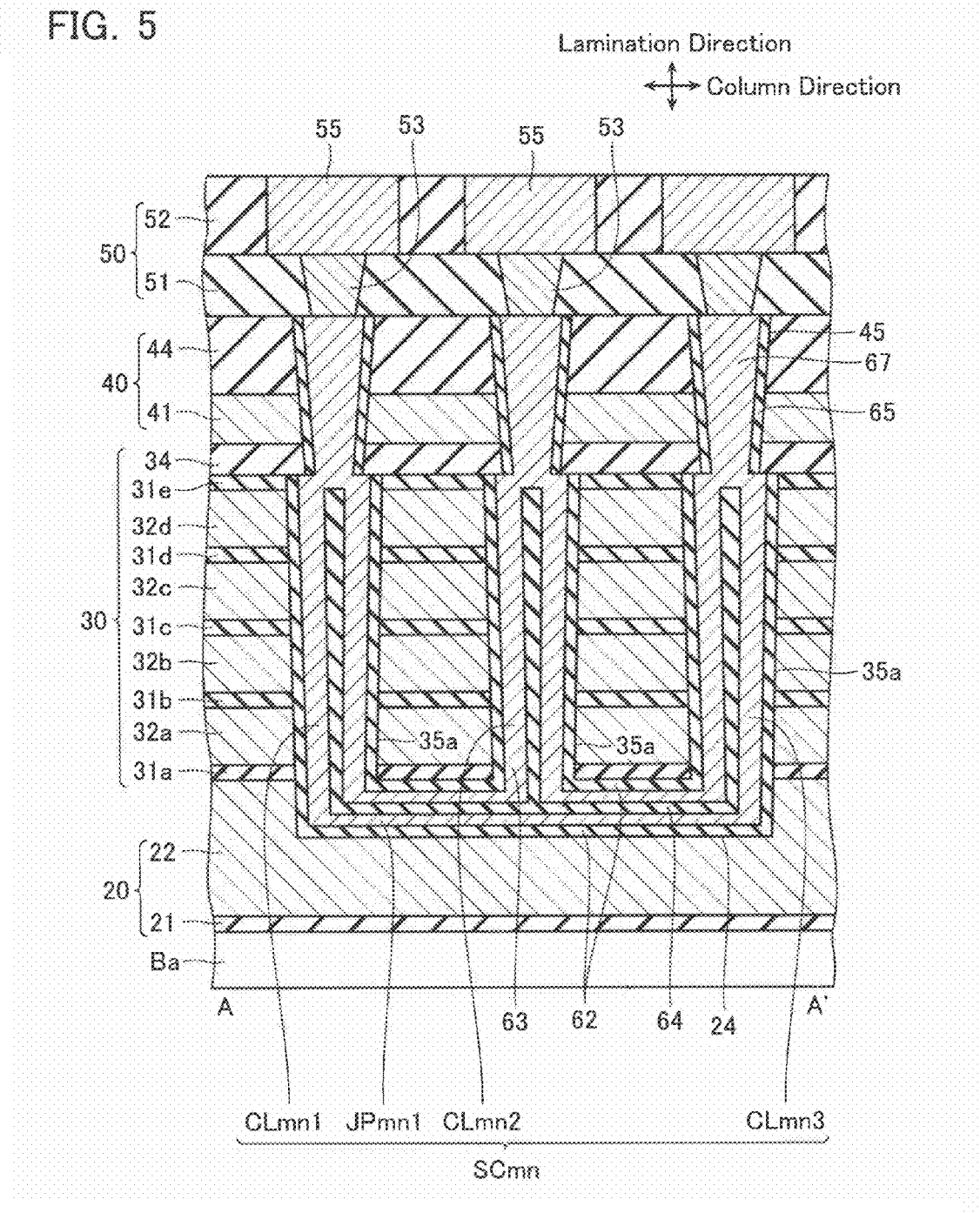
FIG. 5 is a cross-sectional view taken along the line A-A' of FIG. 4.
Figure 6:
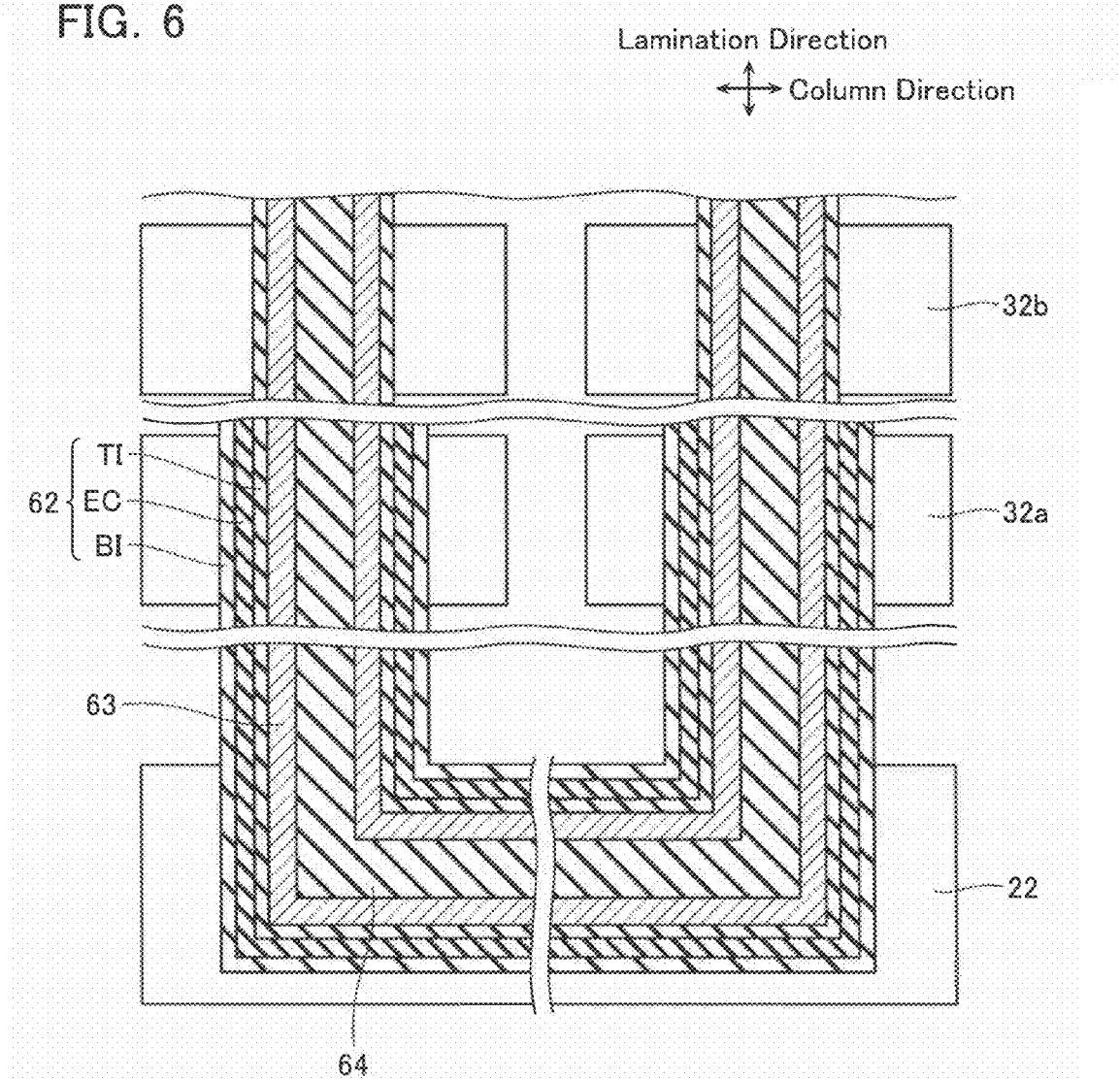
FIG. 6 is an enlarged view of a part of FIG. 5.
Figure 7:
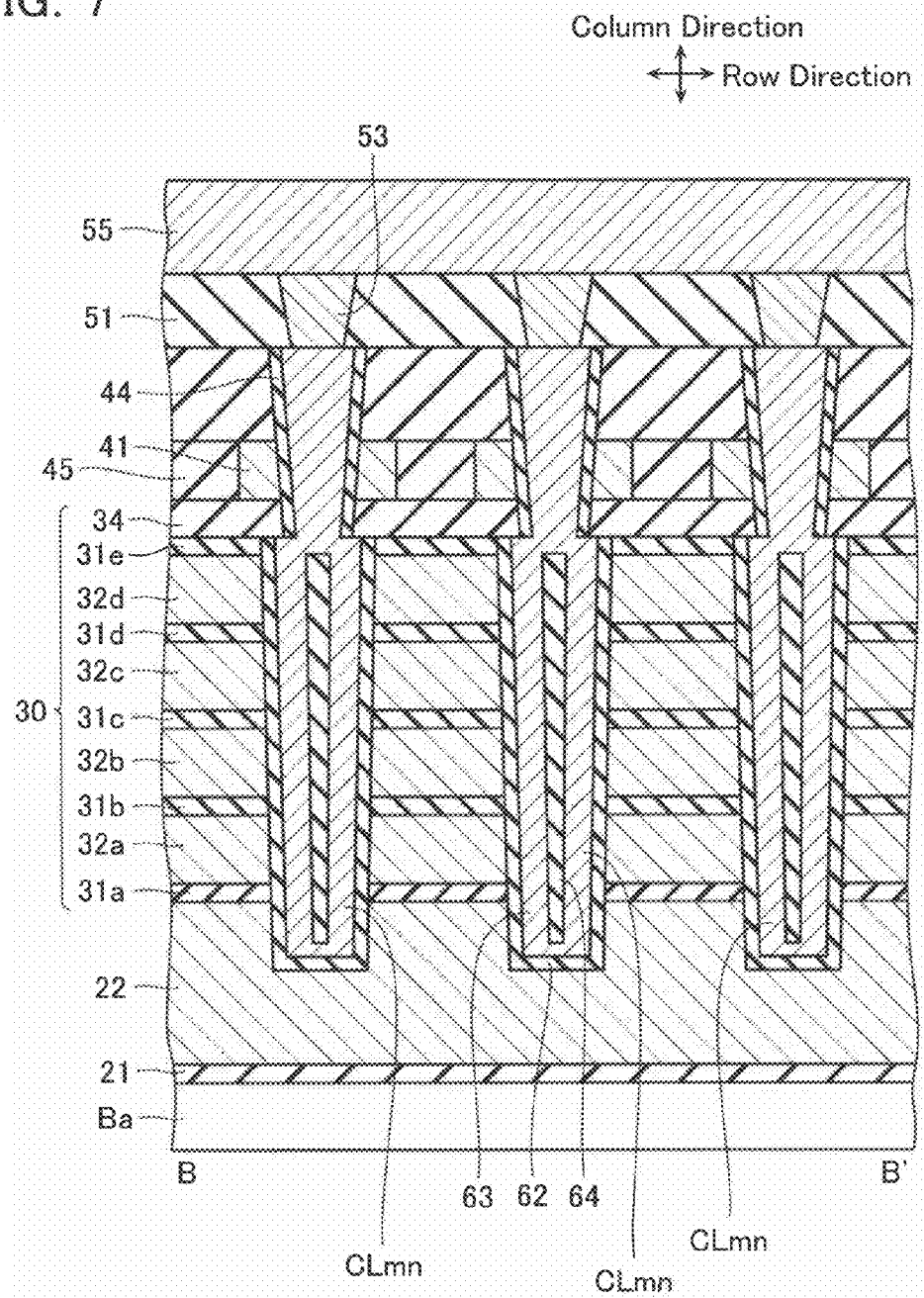
FIG. 7 is a cross-sectional view taken along the line B-B' of FIG. 4.

Referring to FIGS. 4 to 7, a specific shape of the memory transistor area 12 in the non-volatile semiconductor storage device 100 according to the first embodiment will be described below. FIG. 4 is a plan view of the memory transistor area 12; FIG. 5 is a cross-sectional view taken along the line A-A' of FIG. 4; FIG. 6 is a partial enlarged view thereof; and FIG. 7 is a cross-sectional view taken along the line B-B' of FIG. 4.

As illustrated in FIG. 4, bit lines BL are formed in the memory cell transistor area 12, with the row direction taken as the longitudinal direction, and with a wiring width of 2 F and wiring pitch of 3 F (where F denotes a minimum resolution width). Selection gate lines CG are also formed therein, with the column direction taken as the longitudinal direction, and with a wiring width of 2 F and wiring pitch of 3 F, as well. The above-mentioned columnar portions CLmn1 to CLmn3 are formed at respective intersections between the bit lines BL and the selection gate lines CG so as to penetrate near the center of their intersecting positions.

As illustrated in FIG. 5, the memory cell transistor area 12 (one memory string MS) has a back gate transistor layer 20, a memory transistor layer 30, a selection transistor layer 40, and a wiring layer 50, in order from the semiconductor substrate Ba to the lamination direction.

The back gate transistor layer 20 functions as the above-mentioned back gate transistor BG, and has a surface on which the joining portion $JP_{mn}$ of a W-shaped semiconductor layer $SC_{mn}$ is formed. The memory transistor layer 30 functions as the above-mentioned memory transistors MC. The selection transistor layer 40 functions as the above-mentioned selection transistors SG. The wiring layer 50 has bit lines BL formed therein.

The back gate transistor layer 20 has a back gate interlayer insulation layer 21 and a back gate conductive layer 22 corresponding to the back-gate line BG, which layers are sequentially laminated on the semiconductor substrate Ba. The back gate interlayer insulation layer 21 and the back gate conductive layer 22 are formed to expand to the ends of the memory transistor area 12 in the row and column directions.

The back gate conductive layer 22 is formed to cover the bottom and side surfaces of the joining portion $JP_{mn}$, and as high as the top surface thereof.

The back gate interlayer insulation layer 21 is composed of silicon oxide ($SiO_2$). The back gate conductive layer 22 is composed of polysilicon (p-Si).

The memory transistor layer 30 has first to fifth insulation layers between word lines 31a to 31e and first to fourth word-line conductive layers 32a to 32d that are alternately laminated on the back gate conductive layer 22. The latter are conductive layers corresponding to the above-mentioned word lines WL1 to WL4, while the former are interlayer insulation films deposited between the word lines WL1 to WL4. The memory transistor layer 30 also has memory protection insulation layers 34 that are deposited on the fourth insulation layers between word lines 31e.

The first to fifth insulation layers between word lines 31a to 31e are composed of silicon oxide ($SiO_2$). The first to fourth word-line conductive layers 32a to 32d are composed of polysilicon (p-Si). The memory protection insulation layers 34 are composed of silicon nitride (SiN).

Although not illustrated in FIG. 5, the first to fifth insulation layers between word lines 31a to 31e and the first to fourth word-line conductive layers 32a to 32d are processed in a stepwise manner in relation to each other for connection to the contacts at their column-direction ends, as illustrated in FIG. 1. The memory protection insulation layers 34 are formed to cover the respective row- and column-direction ends of the first to fifth insulation layers between word lines 31a to 31e and the first to fourth word-line conductive layers 32a to 32d.

The above-mentioned columnar portions CLmn1 to CLmn3 are formed within three memory holes 35a that are provided to penetrate the first to fifth insulation layers between word lines 31a to 31e and the first to fourth word-line conductive layers 32a to 32d. The above-mentioned joining portion $JP_{mn}$ is further formed within a back gate hole 24 that is formed on the surface of the back gate transistor layer 20 below the memory holes 35a. As a result, a W-shaped semiconductor layer $SC_{mn}$ is formed.

ONO films 62 are formed on the respective walls of the back gate hole 24 and the memory holes 35a. As illustrated in the enlarged view of FIG. 6, each ONO film 62 includes a block insulation layer BI, an electric charge storage layer EC, and a tunnel insulation layer TI deposited therein in the stated order as viewed from the word line side. Each block insulation layer BI is composed of silicon oxide ($SiO_2$). Each electric charge storage layer EC is composed of silicon nitride (SiN) and accumulates electric charges for retaining data. Each tunnel insulation layer TI is composed of silicon oxide ($SiO_2$). This means that the memory gate insulation layers 62 are composed of ONO layers and function as electric charge storage layers for accumulating electric charges.

A conductive film 63 is formed within the back gate hole 24 and the memory holes 35a via the ONO films 62. The conductive film 63 has a hollow therein, and an internal insulation layer 64 is formed to fill the hollow. The W-shaped semiconductor layer $SC_{mn}$ is formed with the conductive film 63 and the internal insulation layer 64.

The selection transistor layer 40 has selection-gate-line conductive layers 41 and interlayer insulation layers 44 that are formed on the memory protection insulation layers 34. The selection-gate-line conductive layers 41 function as the above-mentioned selection gate lines SG. The selection-gate-line conductive layers 41 and the interlayer insulation layers 44 are formed in repeated lines such that extend in the column direction as the longitudinal direction and with a predetermined interval F in the row direction. The selection-gate-line conductive layers 41 are composed of polysilicon (p-Si). The interlayer insulation layers 44 are composed of silicon oxide ($SiO_2$).

In addition, the selection transistor layer 40 has selection-transistor-side holes 45 that are formed to penetrate the interlayer insulation layers 44 and the selection-gate-line conductive layers 41. The selection-transistor-side holes 45 are formed at positions matching the memory holes 35a.

In this configuration, gate insulation layers 65 are formed on the sidewalls facing the selection-transistor-side holes 45. Conductive films 67 are formed to fill the holes 45 via the gate insulation layers 65. The gate insulation layers 65 are composed of silicon oxide ($SiO_2$), and the conductive films 67 are formed by polysilicon. The gate insulation layers 65 function as the gate insulation films of the selection transistors SG. The conductive films 67 function as the channel parts of the selection transistors SG and constitute parts of the respective columnar portions $CL_{mn}$.

The wiring layer 50 has first wiring insulation layers 51, second wiring insulation layers 52, contact layers 53, and bit-line conductive layers 55 that are sequentially laminated on the selection transistor insulation layers 44. The first and second wiring insulation layers 51 and 52 are composed of silicon oxide ($SiO_2$).

In addition, the contact layers 53 are embedded in trenches that are formed to dig into the first wiring insulation layers 51. Furthermore, the bit-line conductive layers 55 are embedded in trenches that are formed to dig into the second wiring insulation layers 52. The bit-line conductive layers 55 are composed of, e.g., tantalum (Ta)-tantalum nitride (TaN)-copper (Cu). As illustrated in FIGS. 5 and 7, one bit-line conductive layer 55 is provided for each columnar portion $CL_{mn}$, with the row direction taken as the longitudinal direction.

Note that the columnar portions $CL_{mn}$ are not connected by a joining portion $JP_{mn}$ in the row direction, as illustrated in FIG. 7, and they belong to independent memory strings MS, respectively.

(Manufacturing Method of Non-Volatile Semiconductor Storage Device 100 in First Embodiment)

Referring now to FIGS. 8 to 14, a method of manufacturing the non-volatile semiconductor storage device 100 according to the first embodiment will be described below. Although the memory transistor area 12 and a peripheral circuit area (not illustrated) are formed at the same time, the following description only focuses the manufacturing process of the memory transistor area 12 in relation to the features of this embodiment for simplicity.

Figure 8:
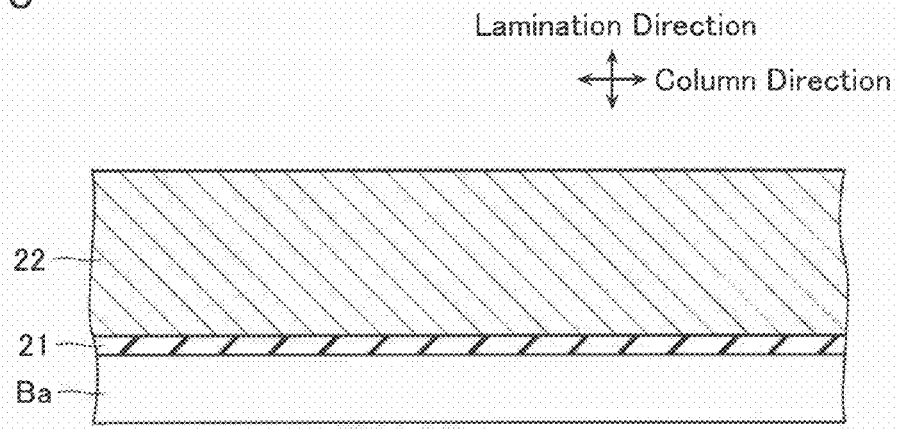
FIG. 8 is a process diagram illustrating a method of manufacturing the non-volatile semiconductor storage device 100 according to the first embodiment.

As illustrated in FIG. 8, silicon oxide ($SiO_2$) and polysilicon (p-Si) are first deposited on the semiconductor substrate, and then a back gate interlayer insulation layer 21 and a back gate conductive layer 22 are formed in the memory transistor area 12 with the lithography method, RIE (Reactive Ion Etching) method, ion injection method, and the like.

Figure 9:
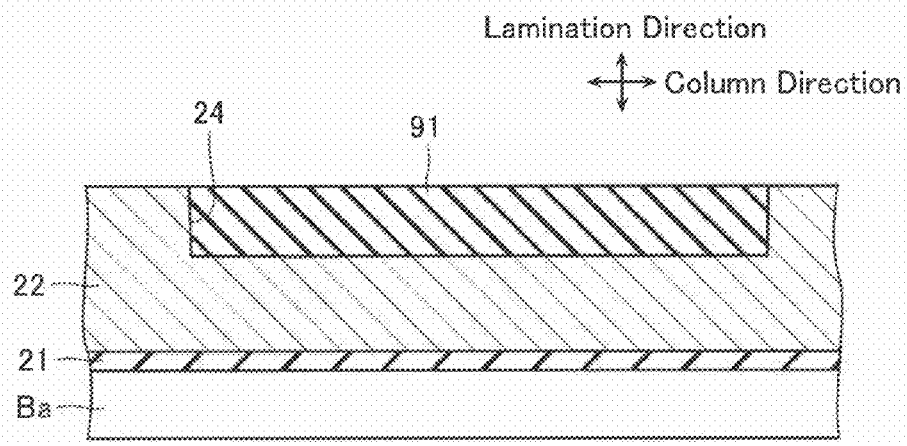
FIG. 9 is a process diagram illustrating a method of manufacturing the non-volatile semiconductor storage device 100 according to the first embodiment.

Then, as illustrated in FIG. 9, the back gate conductive layer 22 is dug down to a depth in the memory transistor area 12 to form a back gate hole 24. The back gate hole 24 is formed in such a way that it has the width direction in the row direction and the longitudinal direction in the column direction, and has an insular aperture for each memory string MS. Such back gate holes 24 are formed at a predetermined interval in the row and column directions.

Then, silicon nitride (SiN) is deposited to fill the back gate hole 24 as a sacrificial film. Subsequently, silicon nitride (SiN) located on the upper portion of the back gate conductive layer 22 is removed by the Chemical Mechanical Polishing (CMP) or RIE method to form a sacrificial layer 91 in the back gate hole 24.

Note that while the back gate hole 24 is formed to such a depth that does not penetrate the back gate conductive layer 22 as illustrated in FIG. 9, it may be formed to penetrate the back gate conductive layer 22.

Figure 10:
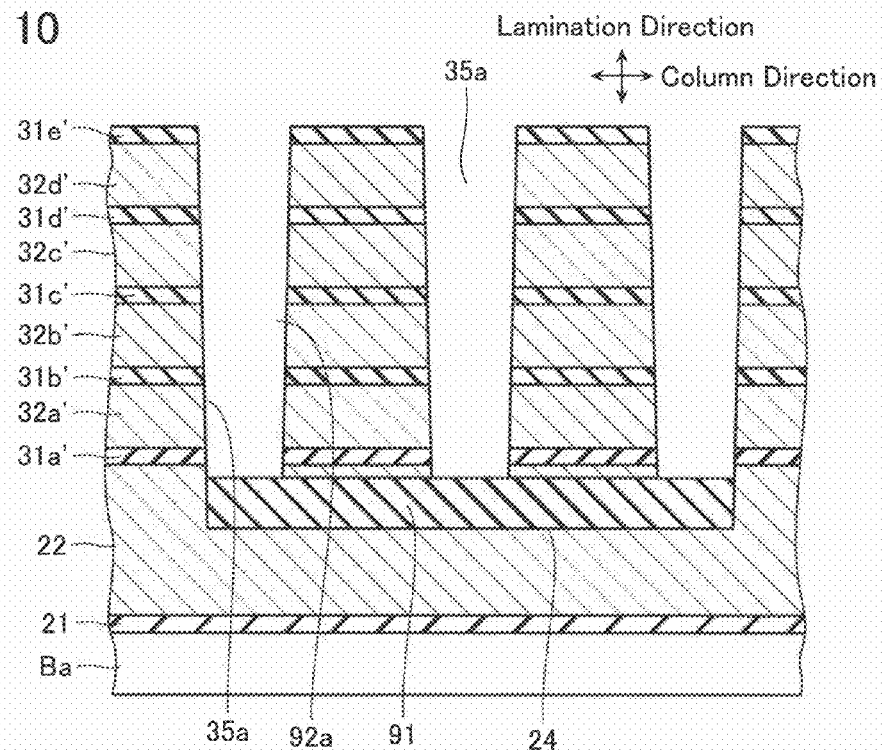
FIG. 10 is a process diagram illustrating a method of manufacturing the non-volatile semiconductor storage device 100 according to the first embodiment.

Then, as illustrated in FIG. 10, silicon oxide ($SiO_2$) and polysilicon (p-Si) are alternately laminated on the back gate conductive layer 22 and the sacrificial layer 91 to form first to fifth insulation layers between word lines 31a' to 31e' and first to fourth polysilicon conductive layers 32a' to 32d'. Subsequently, memory holes 35a are formed to penetrate the first to fifth insulation layers between word lines 31a' to 31e' and the first to fourth polysilicon layers 32a' to 32d'.

The memory holes 35a are formed at respective positions near the opposite ends in the column direction, and near the center of the back gate hole 24, respectively. That is, the three memory holes 35a and the back gate hole 24 together form a W-shape.

Figure 11:
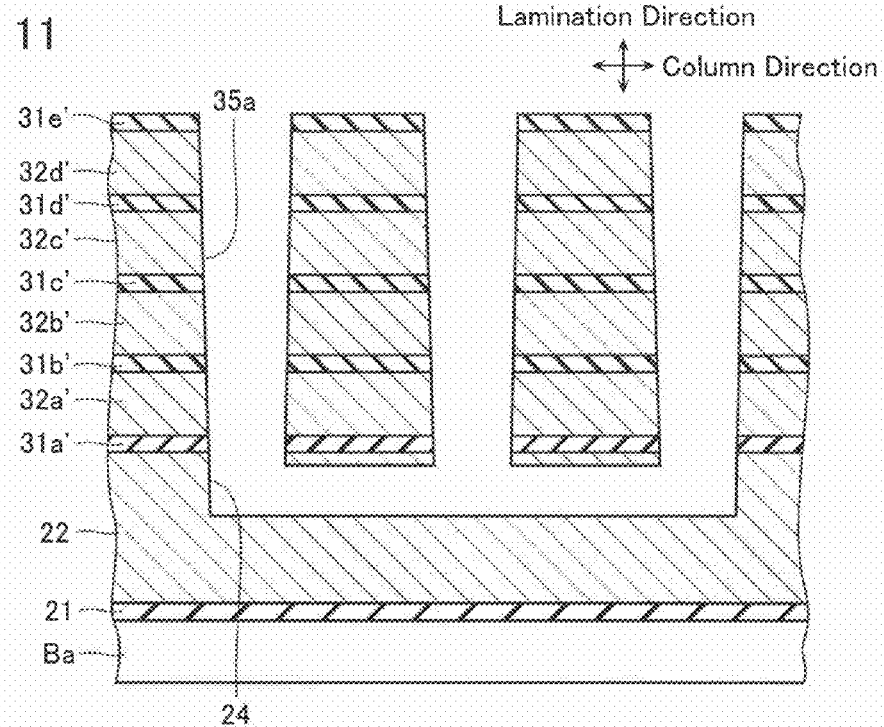
FIG. 11 is a process diagram illustrating a method of manufacturing the non-volatile semiconductor storage device 100 according to the first embodiment.

Then, the sacrificial layer 91 is removed as illustrated in FIG. 11. For example, removal of the sacrificial layer 91 is performed in a hot phosphoric acid solution. Subsequently, a diluted hydrofluoric acid treatment is performed to clean up, and remove any natural oxide film from, the exposed surfaces of the back gate conductive layer 22 and the first to fourth polysilicon layers 32a' to 32d', respectively.

Figure 12:
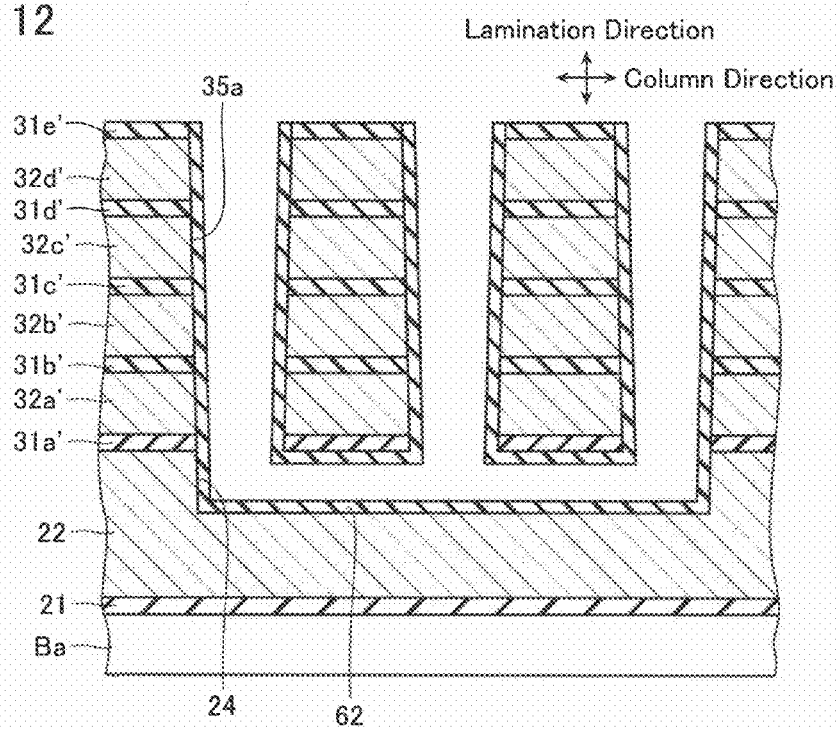
FIG. 12 is a process diagram illustrating a method of manufacturing the non-volatile semiconductor storage device 100 according to the first embodiment.

Then, as illustrated in FIG. 12, a memory gate insulation layer 62 is formed to cover the respective sidewalls facing the back gate hole 24 and the memory hole 35a. Specifically, a memory gate insulation layer 62 is formed on the sidewalls as an ONO film by sequentially depositing silicon oxide ($SiO_2$), silicon nitride (SiN), and silicon oxide ($SiO_2$).

Figure 13:
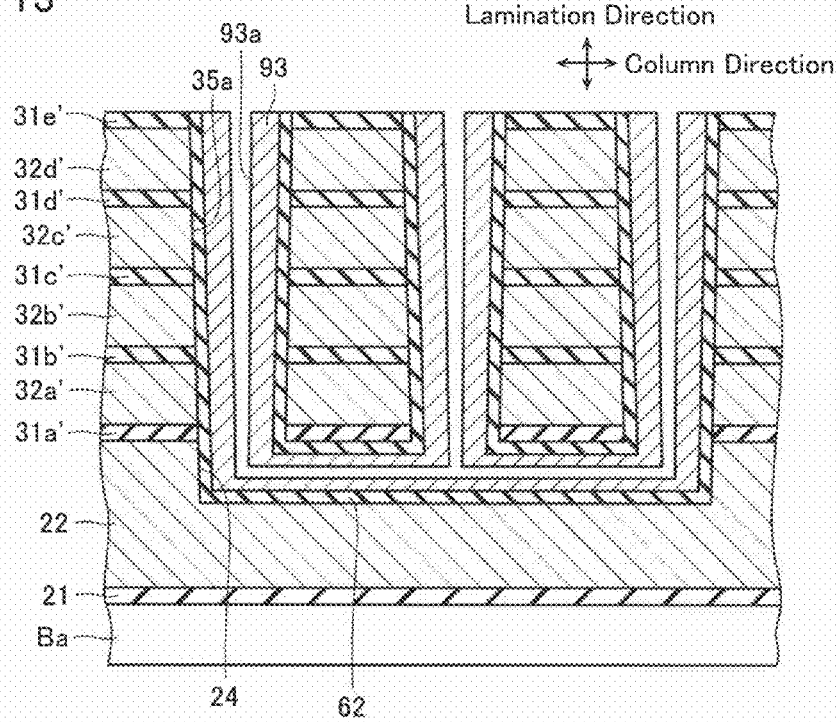
FIG. 13 is a process diagram illustrating a method of manufacturing the non-volatile semiconductor storage device 100 according to the first embodiment.

Then, as illustrated in FIG. 13, amorphous silicon (a-Si) is deposited in the W-shaped void including the memory hole 35a and the back gate hole 24 to form an amorphous silicon layer 93. The amorphous silicon layer 93 is formed to have a hollow 93a. In other words, the amorphous silicon layer 93 is formed in such a way that it will not completely fill the back gate hole 24 and the memory hole 35a.

Figure 14:
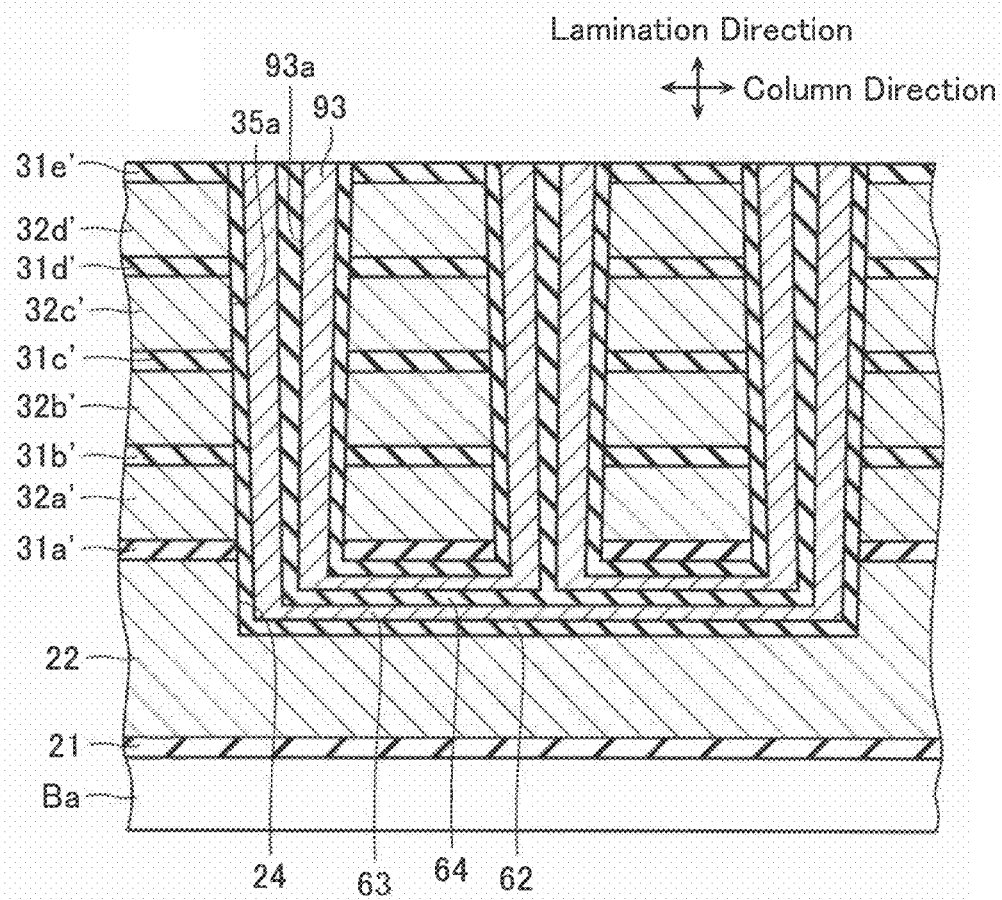
FIG. 14 is a process diagram illustrating a method of manufacturing the non-volatile semiconductor storage device 100 according to the first embodiment.

Then, as illustrated in FIG. 14, the sidewalls of the amorphous silicon layer 93 facing the hollow 93a are thermally oxidized to form silicon oxide ($SiO_2$). In addition, the remaining portions of the amorphous silicon layer 93 are crystallized to form polysilicon (p-Si) thereby forming a W-shaped conductive film 63.

In addition, silicon oxide ($SiO_2$) is further deposited on the silicon oxide ($SiO_2$) formed in the hollow 93a of the W-shaped semiconductor layer 63 with the CVD (Chemical Vapor Deposition) method, and an internal insulation layer 64 is formed to fill the hollow 93a.

Furthermore, those portions of the memory gate insulation layer 62, the conductive layer 63, and the internal insulation layer 64 are removed by CMP process that are deposited on the insulation layer between word lines 31e'.

Thereafter, a selection transistor layer 40, a wiring layer 50, a peripheral circuit area, and a contact area are generated according to the method as disclosed in, e.g., an earlier Japanese patent application, Laid-Open No. 2007-266143, filed by the same applicant, whereby the non-volatile semiconductor storage device 100 is manufactured as illustrated in FIG. 1.

(Operations of Non-Volatile Semiconductor Storage Device 100 in First Embodiment)

Referring again to FIGS. 1 to 3, operations of the non-volatile semiconductor storage device 100 according to the first embodiment will be described below. The description is given of the "write operation", "erase operation", and "read operation" of a memory transistor MC. Note that, by way of example, the following description explains a case where the memory transistor MC2 illustrated in FIG. 3 is the target of write and read operations.

(Write Operation)

Figure 15:
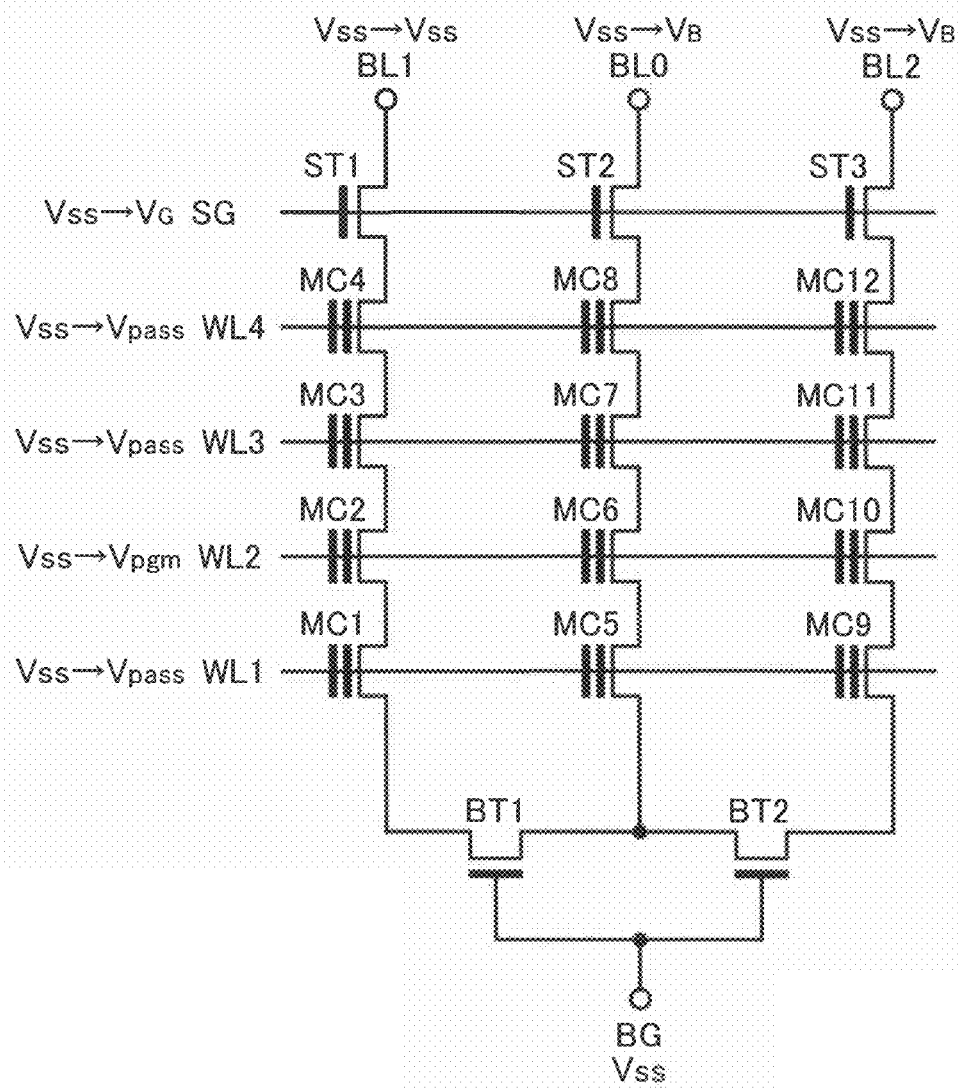
FIG. 15 is an equivalent circuit diagram illustrating a write operation of the non-volatile semiconductor storage device 100 according to the first embodiment.

Referring first to FIG. 15, for example, a write operation to the memory transistor MC2 in a memory string MS will be described below. At the beginning, as an initial operation, the voltage of all bit lines BL0 to BL2 is set to the ground potential VSS, and the voltage of the back-gate line BG is set to the ground potential Vss, whereby back gate transistors BT1 and BT2 are kept at non-conducting states. The voltage of the selection gates SG is also set to the ground voltage Vss, and thus the selection transistors ST1 to ST3 are also kept at non-conducting states.

Then, a predetermined voltage Vg is applied to the selection gate SG connected to the memory string MS in which the memory transistor MC2 is positioned, whereby the selection transistors ST1 to ST3 are set to conducting states. Note that the voltage Vg is not applied to other selection gates SG connected to non-selected memory strings MS that are not written, and thus the body potential (channel potential: the potential of the columnar portions $CL_{mn}$) of the non-selected memory strings MS is kept at a floating state.

Then, while the bit line BL1 connected to the memory transistor MC2 to be written remains at the ground potential Vss, the remaining bit lines BL0 and BL2 are raised to a predetermined bit-line voltage $V_B$. As a result, the body potential of the memory cells MC5 to MC12 that are not written is isolated from the bit lines BL and set to a floating state, preventing any write to these memory cells. Through this operation, only the body potential of the columnar portion CLmn1 in which the memory transistor MC2 to be written is positioned will be fixed to the ground voltage VSS.

From this state, the voltage of each word line WL1 to WL4 is raised to as high as a voltage Vpass (on the order of 8V) that causes the memory transistor MC to become conducting without write, and then the voltage of the word line WL2 to which the memory transistor MC2 to be written to is connected is further raised to a write voltage Vpgm (20V or more). In this way, data is written to the desired memory transistor MC2.

As can be seen from the above, during the write operation, individual write control may be achieved over memory transistors by setting the back gate transistors BT1 and BT2 to non-conducting states (OFF) and isolating the memory transistors MC1 to MC4 along the columnar portion CLmn1 from the memory transistors MC9 to MC12 along the columnar portion CLmn2. That is, even if the bit-line voltage for write operation is applied to ones of the memory transistors, the others will not be affected since that voltage will not be applied thereto.

Note that while the above-mentioned case is described in the context of the write operation being performed on the memory transistor MC2 along the columnar portion CLmn1, the write operation may also be performed on a memory transistor along the columnar portion CLmn3 in a similar manner. This merely requires the bit line BL2 to be set to the ground voltage Vss and the bit line BL1 to a predetermined voltage $V_B$.

(Erase Operation)

Secondly, an erase operation on a memory transistor in a memory string MS will be described below.

At the beginning, the voltage of all bit lines BL0 to BL2, the selection gate lines SG, the word lines WL1 to WL4, and the back-gate line BG are once lowered to the ground voltage Vss, and the potential then begins to increase for raising the voltage of the bit lines BL0 to BL2 toward an erase voltage Verase. This is followed by raising the potential of the selection gate lines SG from the ground voltage Vss to a predetermined voltage $V_G$. This results in creation of holes at the end of the diffusion layer of the memory transistor MC due to the intense electric field, raising the body potential. In this case, the potential of the selection gate lines SG is raised from the ground voltage Vss to the predetermined voltage $V_G$ for the purpose of preventing the gate insulation layers 65 of the selection transistors ST from reaching a dielectric breakdown voltage. The body potential is eventually raised to near the erase voltage Verase. With the electric field caused by the body potential and the voltage Vss of the word lines WL, data is erased from the entire memory transistors in the block including the memory string MS.

Note that the erase operation may be performed by applying the erase voltage Verase to only some of three bit lines BL0 to BL2 connected to one memory string MS, while isolating other bit lines from the sense amplifier circuit and keeping them at floating states. Again, while the back gate transistors BT1 and BT2 may be kept at non-conducting states, the holes generated through the back gate transistors BT1 and BT2 should be injected into the channel part (body) of the memory string MS.

(Read Operation)

Figure 16:
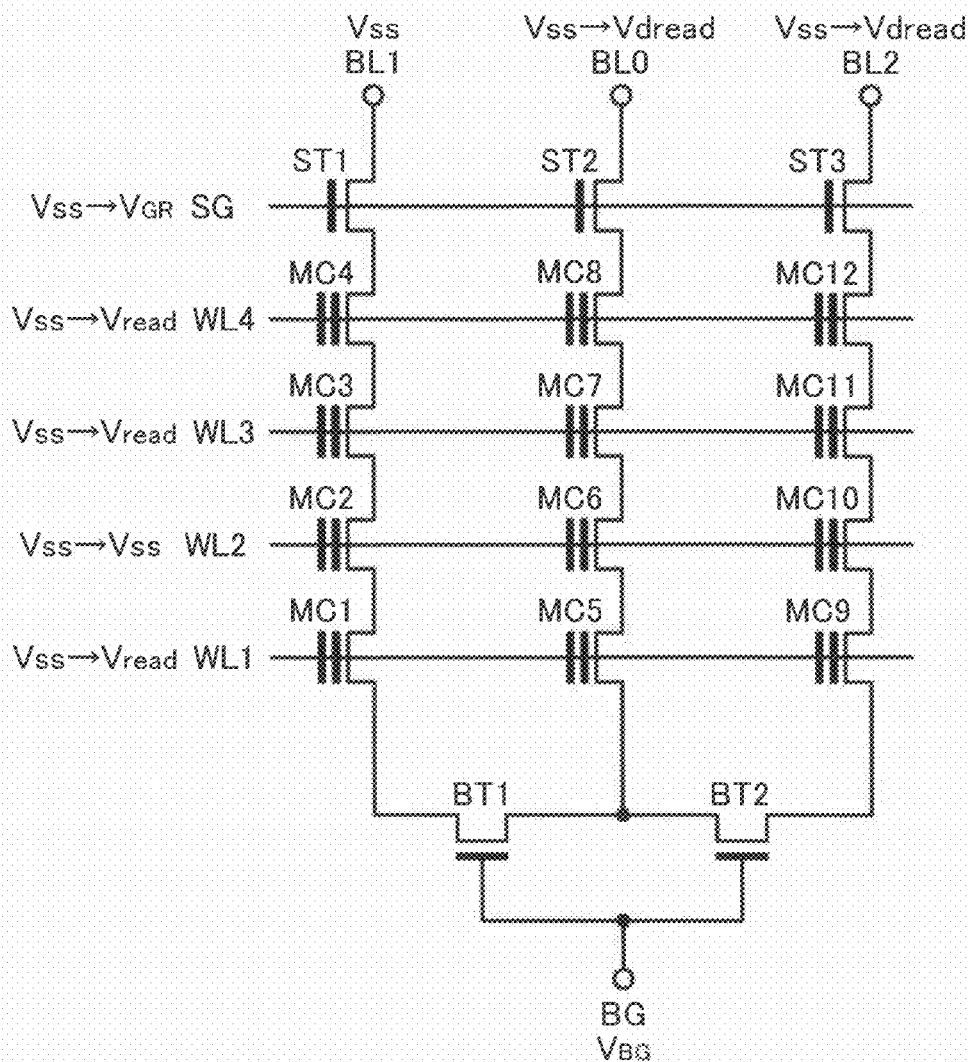
FIG. 16 is an equivalent circuit diagram illustrating a read operation of the non-volatile semiconductor storage device 100 according to the first embodiment.

Thirdly, referring now to FIG. 16, for example, a read operation on a memory transistor MC2 in a memory string MS will be described below.

At the beginning, all bit lines BL0 to BL2 are set to the ground voltage Vss and the voltage of the back-gate line BG is set to a predetermined voltage $V_{BG}$, whereby back gate transistors BT1 and BT2 are set to conducting states (ON).

Then, the voltage of the selection gate lines SG is set to the ground voltage Vss, and the selection transistors ST1 to ST3 are then turned OFF. Subsequently, the bit lines BL0 and BL2, other than the bit line BL1 connected to the memory transistor MC2 to be read, are provisionally set to the voltage Vdread.

Thereafter, the voltage of the word line WL2 connected to the control gate of the memory transistor MC2 to be read is set to the ground voltage Vss, while the voltage of the other word lines WL1, 3, and 4 is set to a read voltage Vread. The read voltage Vread has a value greater than the threshold voltage of the memory transistor MC after data is written thereto. Accordingly, the memory transistor MC2 to be read becomes conductive for data "1" and non-conductive for data "0". On the other hand, other memory transistors MC without reading are set to conducting states, irrespective of whether the retaining data is "0" or "1".

As described above, the memory cells MC5 to MC8 along the columnar portion CLmn2 are always in erase states, and thus at least memory transistors MC5 to MC8 become conducting whenever the voltage Vdread is applied to the bit lines BL0 and BL2, the ground voltage Vss is applied to the bit line BL1, and these voltages are further applied to the word lines WL1 to WL4. Accordingly, the voltage for data read may also be supplied to the memory cells MC1 to MC4 via the selection transistor ST2, the memory transistors MC5 to MC8, and the back gate transistor BT1 (the voltage of the back-gate line BG may be raised to near the voltage Vdread). During this state, data in the memory cell MC2 may be read by sensing the potential of the bit line BL1 at a sense amplifier.

Note that while the voltage Vdread is applied to the bit line BL2 and the channel potential is raised to near the voltage Vdread at the memory cells MC9 to MC12, no through current flows between the bit lines BL0 and BL2 because the bit line BL0 also involves substantially the same potential, thereby minimizing the impact on the read operation.

(Advantages of Non-Volatile Semiconductor Storage Device 100 in First Embodiment)

Advantages of the non-volatile semiconductor storage device 100 according to the first embodiment will now be described below. As can be seen from the above lamination structure, the non-volatile semiconductor storage device 100 according to the first embodiment may achieve high integration. In addition, as described in the above manufacturing process of the non-volatile semiconductor storage device 100, each layer corresponding to respective memory transistors MC and selection transistor layers ST may be manufactured in a predetermined number of lithography steps, irrespective of the number of laminated word lines WL. That is, the non-volatile semiconductor storage device 100 may be manufactured at a lower cost.

In addition, the non-volatile semiconductor storage device 100 according to the first embodiment has a back-gate line BG in contact with a joining portion $JP_{mn}$ of a W-shaped semiconductor layer $SC_{mn}$. Furthermore, the back-gate line BG functions as a back gate transistor BG for forming a channel in the joining portion $JP_{mn}$. Therefore, a memory string MS with a good conducting property may be provided at a W-shaped semiconductor layer $SC_{mn}$ in a nearly non-doped state.

In addition, since this embodiment utilizes the memory strings MS formed in a W-shape, there will be no need to form any contacts below the memory transistor layer 30. Consequently, the manufacturing process may be simplified and an improved degree of freedom may be obtained for the design of the memory transistor layers, which may result in a more reliable non-volatile semiconductor storage device. In addition, this embodiment does not require any source-line wiring and involves a small number of wiring layers correspondingly, which may reduce the manufacturing costs. If source lines present, and when a large number of cells are read from a plurality of bit lines at the same time, the source-line wiring needs to provide such currents corresponding to the number of cells to be read at the same time, and hence a particularly low-resistance wiring would be required as compared to the bit lines. To this extent, this embodiment uses one of three bit lines BL0 to BL2 connected to one memory string MS as if it were a source line, which allows the respective bit lines BL0 to BL2 to have the same resistance and to be formed in the same wiring layer. Also in this sense, reduced manufacturing costs and improved reliability may be achieved.

Second Embodiment

Figure 17:
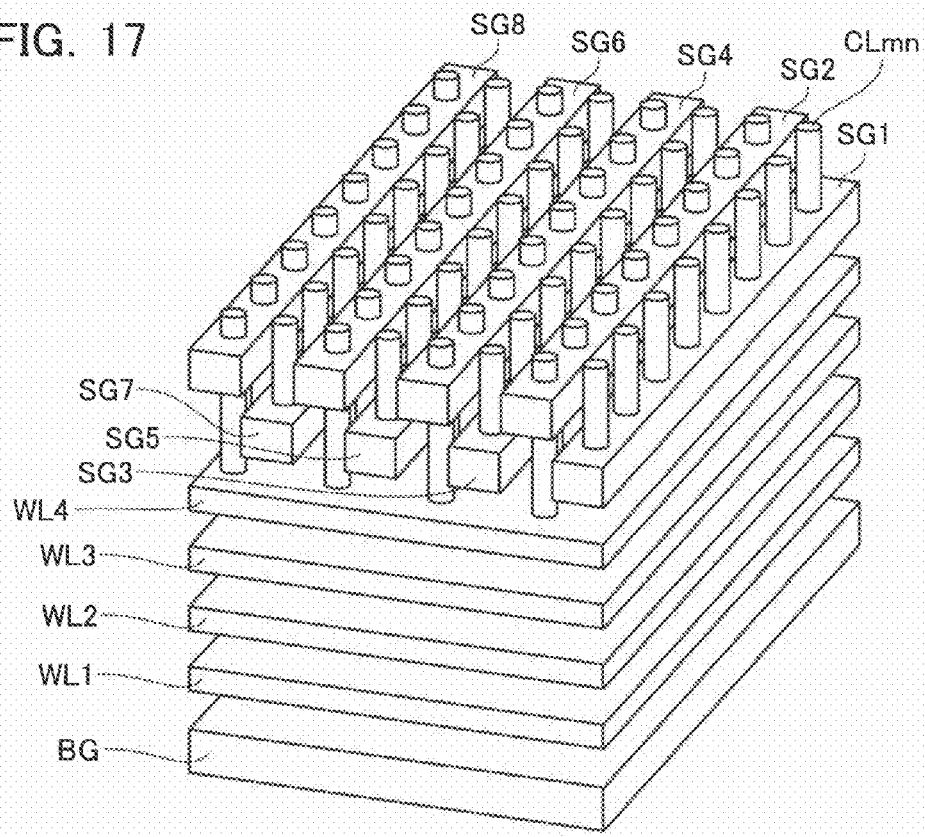
FIG. 17 is a schematic diagram of the memory transistor area 12 in the non-volatile semiconductor storage device 100 according to a second embodiment of the present invention.
Figure 18:
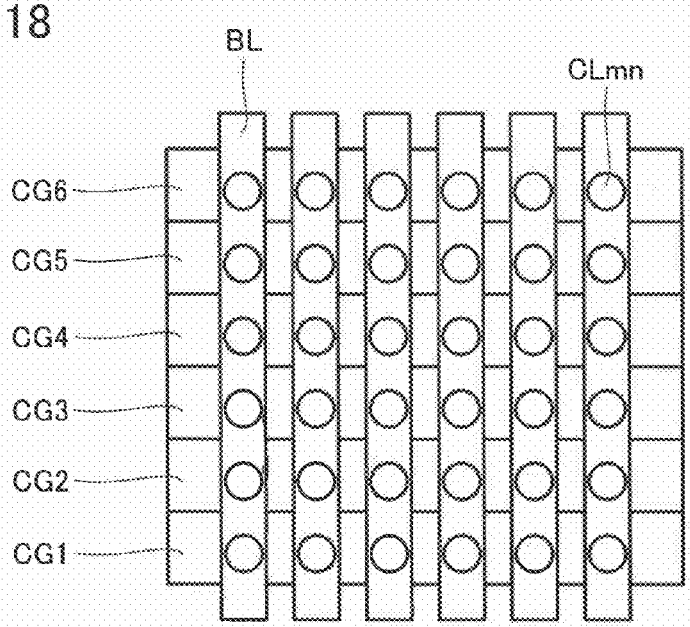
FIG. 18 is a plan view of the memory transistor area 12 in the non-volatile semiconductor storage device 100 according to the second embodiment of the present invention.

FIG. 17 schematically illustrates the memory transistor area 12 in the non-volatile semiconductor storage device 100 according to a second embodiment of the present invention. FIG. 18 is a plan view thereof. Note that the same reference numerals represent the same components as the first embodiment and description thereof will be omitted below.

While this embodiment involves the selection gate lines SG1 to SG8, among these, the odd-numbered selection gate lines SG1, SG3, SG5, and SG7 are formed in lower layers, and the even-numbered selection gate lines SG2, SG4, SG6, and SG8 are formed at positions in between, and above, the respective odd-numbered selection gate lines.

The two-layer alternating type selection gate line structure as mentioned above allows the area to be 4 $F^2$ for each columnar portion $CL_{mn}$.

Note that the number of columnar portions $CL_{mn}$ included in one memory string MS is not limited to three, but may be any number not less than two. Here, a relation between the number of columnar portions $CL_{mn}$ included in one memory string MS and the effective area of the columnar portions in which memory transistors are formed is as follows:

2 columnar portions $CL_{mn}$→8 $F^2$
3 columnar portions $CL_{mn}$→6 $F^2$
4 columnar portions $CL_{mn}$→5 $F^2$
9 columnar portions $CL_{mn}$→4.5 $F^2$ That is, as the number of columnar portions $CL_{mn}$ included in one memory string MS increases, the effective area of the columnar portions $CL_{mn}$ can be smaller, which may contribute to higher memory density.

[Others]

While embodiments of the present invention have been described, the present invention is not intended to be limited to the disclosed embodiments and various other changes, additions, deletions, substitutions or the like may be made thereto without departing from the spirit of the invention. For instance, the above-mentioned embodiments have been described in the context of all of the three columnar portions $CL_{mn}$ included in one memory string being formed by polysilicon material. Instead of polysilicon, however, such a compound containing a metal element, such as a silicon layer or a metal film (such as aluminum), with its surface being silicided through reaction with metal such as cobalt, may be used for, e.g., the columnar portion $CL_{mn}2$ along the memory transistors MC5 to MC8 in which data is always kept at an erase state. Alternatively, high-concentration impurities (such as phosphorus) may be injected only into the columnar portion $CL_{mn}2$ for lowering the resistance. This measurement may reduce the voltage drop, ensuring more reliable read operations.

In addition, while the description has been made in the above embodiments assuming that at least one row of memory transistors MC in one memory string MS are preferably always kept at erase states, the present invention is not limited to this configuration and may not provide such memory transistors MC that are always kept at erase states. In that case, although the potential of the selected word line WL needs to be set higher than the ground potential Vss, and the amount of the read current can possibly be reduced to, in a worst case, about one half of that in the first embodiment, data can be read using a sense amplifier with a sufficient sensitivity and appropriate measures against noise. This allows for more effective use of cell arrays, and the area of columnar portions can be made 4 $F^2$, irrespective of the number of columnar portions included in one memory string MS, contributing to higher density of semiconductor memory devices.

What is claimed is:

1. A non-volatile semiconductor storage device comprising a plurality of memory strings, each having a plurality of electrically rewritable memory cells and selection transistors connected in series, each of the memory strings comprising:
a semiconductor layer having a plurality of columnar portion and a joining portion, the plurality of columnar portions extending in a vertical direction with respect to a substrate, the joining portion being formed to join lower ends of the plurality of columnar portions with a first direction taken as a longitudinal direction;
an electric charge storage layer formed to surround side surfaces of the columnar portions;
a plurality of first conductive layers with a plurality of stacked layers formed to surround side surfaces of the columnar portions and the electric charge storage layer, the first conductive layers functioning as control electrodes of the memory cells;
a second conductive layer formed around the plurality of columnar portions aligned in the first direction via a gate insulation film, with the first direction taken as a longitudinal direction, the second conductive layer functioning as control electrodes of the selection transistors; and
bit lines formed to be connected to the plurality of columnar portions, respectively, with a second direction orthogonal to the first direction taken as a longitudinal direction.

2. The semiconductor storage device according to claim 1, further comprising:
a back gate layer formed in contact with the joining portion via an insulation film, and functioning as a control electrode of a back gate transistor formed in the joining portion.

3. The semiconductor storage device according to claim 1, wherein
the first conductive layers are plate-like electrodes that are commonly connected to the plurality of memory strings arranged in a two-dimensional manner on the substrate.

4. The semiconductor storage device according to claim 3, wherein
the second conductive layer is formed in a stripe pattern, with the first direction taken as a longitudinal direction.

5. The semiconductor storage device according to claim 1, wherein
the memory cells that are formed along at least one of the plurality of columnar portions included in one of the memory strings are always kept at erase states.

6. The semiconductor storage device according to claim 5, further comprising:
a back gate layer formed in contact with the joining portion via an insulation film, and functioning as a control electrode of a back gate transistor formed in the joining portion.

7. The semiconductor storage device according to claim 5, wherein
the first conductive layers are plate-like electrodes that are commonly connected to the plurality of memory strings arranged in a two-dimensional manner on the substrate.

8. The semiconductor storage device according to claim 5, wherein
the second conductive layer is formed in a stripe pattern, with the first direction taken as a longitudinal direction.

9. The semiconductor storage device according to claim 1, wherein
at least one of the plurality of columnar portions included in one of the memory strings is a compound containing a metal element.

10. The semiconductor storage device according to claim 1, wherein
the semiconductor layer has a hollow therein, and includes an internal insulation layer formed to fill the hollow.

11. A non-volatile semiconductor storage device comprising a plurality of memory strings, each having a plurality of electrically rewritable memory cells and selection transistors connected in series, each of the memory strings comprising:
a semiconductor layer having a plurality of columnar portion and a joining portion, the plurality of columnar portions extending in a vertical direction with respect to a substrate, the joining portion being formed to join lower ends of the plurality of columnar portions with a first direction taken as a longitudinal direction;
an electric charge storage layer formed to surround side surfaces of the columnar portions;
a plurality of first conductive layers formed in a laminated fashion to surround side surfaces of the columnar portions and the electric charge storage layer, the first conductive layers functioning as control electrodes of the memory cells;
a second conductive layer formed around the three columnar portions aligned in the first direction via a gate insulation film, with the first direction taken as a longitudinal direction, the second conductive layer functioning as control electrodes of the selection transistors; and
bit lines formed to be connected to the three columnar portions, respectively, with a second direction orthogonal to the first direction taken as a longitudinal direction.

12. The semiconductor storage device according to claim 11, further comprising:
a back gate layer formed in contact with the joining portion via an insulation film, and functioning as a control electrode of a back gate transistor formed in the joining portion.

13. The semiconductor storage device according to claim 11, wherein
the first conductive layers are plate-like electrodes that are commonly connected to the plurality of memory strings arranged in a two-dimensional manner on the substrate.

14. The semiconductor storage device according to claim 13, wherein
the second conductive layer is formed in a stripe pattern, with the first direction taken as a longitudinal direction.

15. The semiconductor storage device according to claim 11, wherein
the memory cells that are formed along at least one of the three columnar portions included in one of the memory strings are always kept at erase states.

16. The semiconductor storage device according to claim 15, further comprising:
a back gate layer formed in contact with the joining portion via an insulation film, and functioning as a control electrode of a back gate transistor formed in the joining portion.

17. The semiconductor storage device according to claim 15, wherein
the first conductive layers are plate-like electrodes that are commonly connected to the plurality of memory strings arranged in a two-dimensional manner on the substrate.

18. The semiconductor storage device according to claim 15, wherein
the second conductive layer is formed in a stripe pattern, with the first direction taken as a longitudinal direction.

19. The semiconductor storage device according to claim 11, wherein
at least one of the three columnar portions included in one of the memory strings is a compound containing a metal element.

20. The semiconductor storage device according to claim 11, wherein
the semiconductor layer has a hollow therein, and includes an internal insulation layer formed to fill the hollow.

* * * * *